(12) United States Patent
Ozee

(10) Patent No.: US 6,199,291 B1
(45) Date of Patent: Mar. 13, 2001

(54) ALIGNMENT FIXTURE

(75) Inventor: Jeffery E. Ozee, San Antonio, TX (US)

(73) Assignees: Sony Corporation, Tokyo (JP); Sony Electronics, Inc., Park Ridge, NJ (US)

( * ) Notice: Subject to any disclaimer, the term of this patent is extended or adjusted under 35 U.S.C. 154(b) by 0 days.

(21) Appl. No.: 09/124,503

(22) Filed: Jul. 29, 1998

(51) Int. Cl.[7] .............................. B23Q 17/22; B23Q 3/00
(52) U.S. Cl. ............................. 33/645; 33/533; 414/935
(58) Field of Search ........................ 33/645, 533, 613; 414/935, 936, 940, 941

(56) References Cited

U.S. PATENT DOCUMENTS

| | | | |
|---|---|---|---|
| 2,963,090 | * 12/1960 | Cole et al. | 33/645 |
| 3,088,307 | * 5/1963 | Gray | 33/645 |
| 4,196,522 | * 4/1980 | Bell et al. | 33/533 |
| 5,454,170 | * 10/1995 | Cook | 33/645 |
| 5,860,640 | * 1/1999 | Marohl et al. | 269/289 R |
| 5,970,818 | * 10/1999 | Kikuchi et al. | 74/526 |

* cited by examiner

Primary Examiner—Diego Gutierrez
Assistant Examiner—F. Francis
(74) Attorney, Agent, or Firm—Roland P. Kananen; Rader, Fishman & Grauer

(57) ABSTRACT

An alignment fixture that may be used to align the components of a wafer etching machine. The fixture includes a base supporting at least one first alignment guide and a plurality of second alignment guides. The components to be aligned using the fixture may include inner and outer concentric rings. The outer ring may include one or more first position locator guides that are matched with the first alignment guide to establish a known positional relationship with the base. The inner ring may include one or more second position locator guides that are matched simultaneously with one or more first position locator guides and the second alignment guides to establish a known positional relationship between the outer ring and the inner ring. The outer and inner ring may be secured together in the established positional relationship using a conventional fastening means known in the art.

16 Claims, 2 Drawing Sheets

ALIGNMENT FIXTURE

FIELD OF THE INVENTION

The present invention relates generally to an apparatus and method for aligning components used in a wafer etching machine. More particularly, the invention relates to an alignment fixture for aligning concentric rings used in a wafer etching machine, the machine including a base supporting a plurality of openings and a channel supported by the base.

BACKGROUND OF THE INVENTION

Conventional wafer etching machines include concentric inner and outer rings that secure a wafer in place over an electrode. The outer ring may be placed in the machine in only one orientation and is typically fabricated of stainless steel. The inner ring is often manufactured of a ceramic material and includes a plurality of radially extending fingers. The fingers engage and apply pressure to a substantially circular wafer to hold the wafer in place on the electrode. Occasionally, the rings must be removed from the machine and cleaned.

Once the rings are removed from the machine, there are no markers on either the machine or the rings to aid with the reinstallation of same. Technicians often use the "eyeball" method to visually align the rings with one another and with the machine. Another technique, involves using a straight edge to align the inner and outer rings and to orient the outer ring with the machine. These methods often result in ring alignment errors.

Evidence of errors resulting from improperly aligned rings may not appear for several hours after reinstallation of the rings. Typical alignment errors include improper seating of the outer ring in the machine or repeated attempts to align the ring properly with the machine. With respect to the inner ring, if all but one of the fingers of the inner ring do not engage the wafer, the wafer may be improperly seated over the electrode, resulting in improper etching of the wafer. All wafers improperly etched due to the misalignment must be discarded or reworked, resulting in increased production cost and time.

In addition to increased production cost, imprecise alignment methods result in prolonged maintenance periods. It generally requires approximately two hours of machine downtime to correcting misalignment problems. Consequently, a tool is needed that will permit proper alignment of the rings and orientation of the outer ring prior to their installation in the machine.

SUMMARY OF THE INVENTION

The present invention relates generally to the fabrication of an alignment fixture for use in aligning the components of a wafer etching machine. The alignment fixture includes a base and first and second alignment guides supported by the base in a predetermined configuration.

The components to be aligned using the fixture may include a first member and a second member. The first member may include one or more first position locator guides that are matched with the second alignment guides to establish a known positional relationship with the base. The second member may include one or more second position locator guides that are matched simultaneously with one or more first position locator guides and one or more first alignment guides to establish a known positional relationship between the first member and the second member. The first member and second member may be secured together in the established positional relationship using conventional fastening means known in the art.

DESCRIPTION OF THE DRAWINGS

The features and inventive aspects of the present invention will become more apparent upon reading the following detailed description, claims and drawings, of which the following is a brief description:

DESCRIPTION OF A PREFERRED EMBODIMENT

Figure 1:
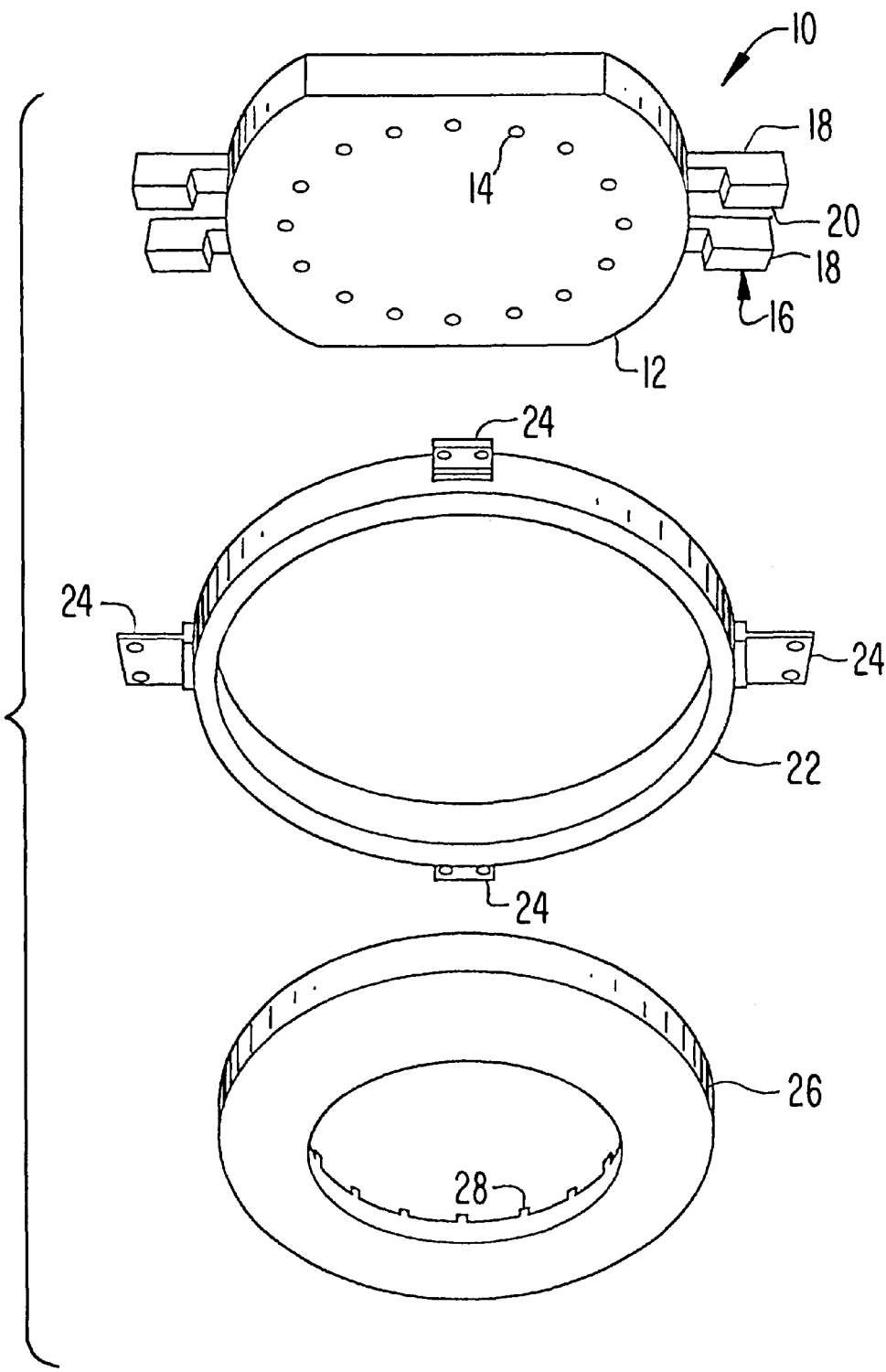
FIG. 1 is a perspective view showing an exploded view of an alignment fixture and ring assembly formed in accordance with the teaching of the present invention.

FIG. 1 shows a preferred embodiment of an alignment fixture 10 formed in accordance with the teachings of this invention. The alignment fixture 10 includes a base 12, a plurality of alignment guides 14, and a channel 16.

The base 12 may be fabricated using light weight plastic such as high density polyethylene or any other material having similar properties. The plastic material helps to reduce the risk of damaging the components to be aligned on the base 12.

A plurality of complementary alignment guides 14 are supported by the base 12 in a predetermined configuration. In a preferred embodiment, the alignment guides 14 are openings 14 radially spaced around the circumference of the base 12. The alignment guides 14 extend through the top surface and partially into the depth of the base 12. The top edge of each opening includes a chamfered edge.

Figure 2:
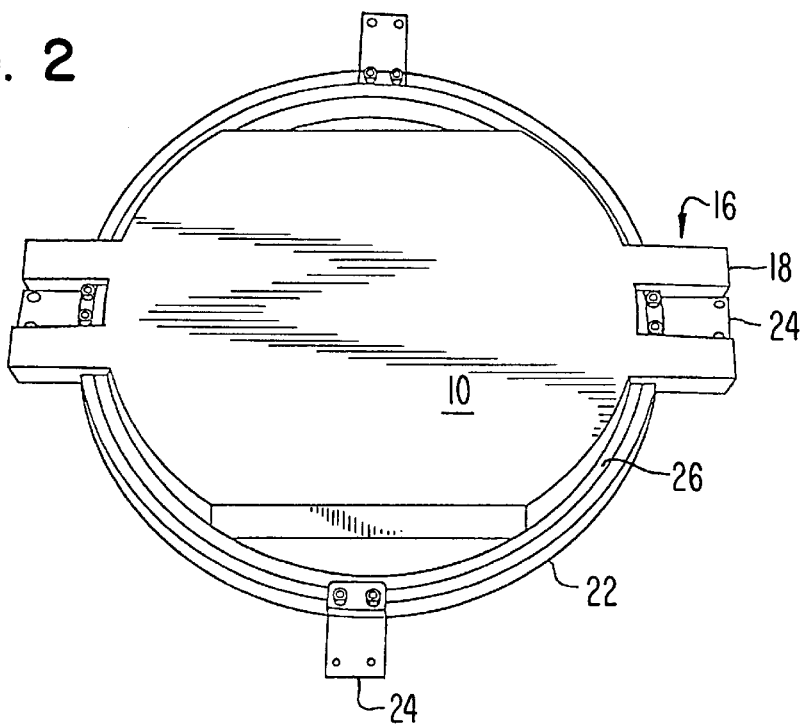
FIG. 2 is a bottom plan view of the alignment fixture and ring assembly shown in FIG. 1.

The channel 16 is carried by the base 12. As illustrated in FIGS. 1 and 2, the channel 16 and the base 12 may be integrally formed. However, the channel 16 may be formed as a separate component. The channel 16 includes two opposing arms 18 projecting outwardly from the outer perimeter of the base 12. The arms 18 define a u-shaped central opening 20.

OPERATION

Figure 3:
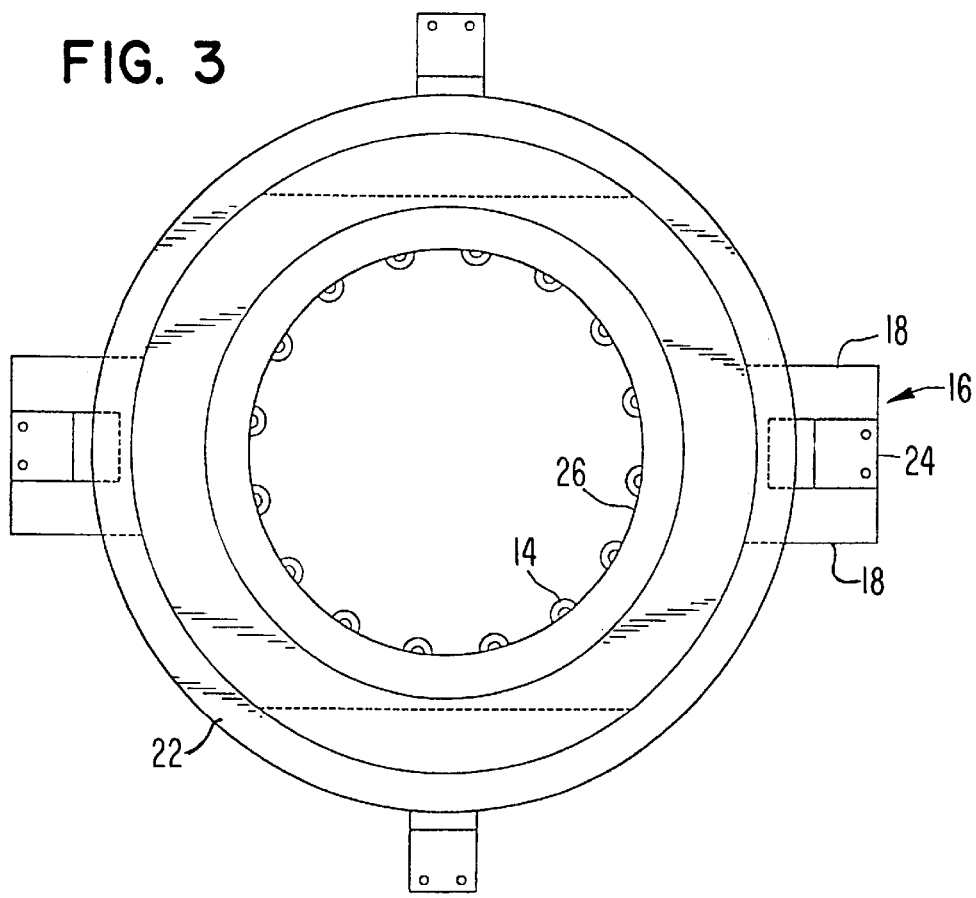
FIG. 3 is a top plan view of the aligned fixture and ring assembly shown in FIG. 1.

As shown in FIGS. 1–3, the components to be aligned include an outer ring 22 and an inner ring 26. The outer ring 22 is placed on the base 12, and includes at least one pair of axially arranged tabs 24 projecting outwardly from the outer perimeter thereof. The outer ring 22 is moveable with respect to the base 12, permitting the centers of at least two of the tabs 24 to be aligned respectively with and received in each of the u-shaped openings 20. The alignment of the tabs 24 with each of the u-shaped openings 20 properly orients the outer ring 22 for insertion into the wafer etching machine.

The inner ring 26 may be fabricated of a ceramic material, and is carried by the base 12 and received in the inner diameter of the outer ring 22. The inner ring 26 defines a plurality of axially spaced fingers 28 extending outwardly from the outer perimeter of the inner ring 26. The inner ring 26 is movable with respect to the base 12 and the outer ring 22. The inner ring 26 may be rotated to permit the alignment of at least two fingers 28 respectively with the center of two of the tabs 24. This placement causes the fingers 28 to line-up with the center of each of the openings 14. Each of the openings 14 receives one of the fingers 28, and the chamfered edge of each opening 14 helps guide the fingers 28 into each respective opening 14. A screw (not shown) passing through an opening defined by the outer ring 22 contacts the inner ring 26 and outer ring 22, and when tightened, secures the inner ring 26 and outer ring 22 in the established positional relationship. One method for aligning the inner ring 26 and outer ring 22 on the alignment fixture 10 includes:

(1) placing the inner ring 26 in the outer ring 22, wherein the rings 26, 22 remain freely rotatable relative to one another;

(2) flipping the ring assembly 26, 22 over such that the assembly is positioned bottom-side up;

(3) positioning the ring assembly 26, 22 on the jig 10 in the bottom-up position;

(4) aligning the center of at least two of the tabs 24 respectively with each of the u-shaped openings 20;

(5) aligning the fingers 28 on the inner ring 26 with the alignment guides 14; and (6) locking the inner ring 26 and outer ring 22 in the established positional relationship.

One of ordinary skill in the art will appreciate that there are other methods by which the outer ring 22 and inner ring 26 may be aligned on the alignment fixture 10. For example, the inner ring 26 and outer ring 22 may be aligned with the bottom-side facing down.

There are a variety of configurations which may be employed in forming the components described herein. For example, the alignment guides 14 may be formed separately from the base 12 and supported by the base in a manner to permit alignment of the inner ring 26. Thus, the disclosed embodiments are given to illustrate the invention. However, they are not meant to limit the scope and spirit of the invention. Therefore, the invention should be limited only by the appended claims.

I claim:

1. An alignment fixture for aligning parts used in a wafer etching machine comprising:

a base;

a first alignment guide supported by the base for establishing a positional relationship with the base; and a plurality of complementary second alignment guides supported by the base in a predetermined configuration, wherein the base supports a first member having at least one first position locator guide matched with the first alignment guide to establish a known positional relationship between the first member and the base;

a second member having at least one second position locator guide matched with at least one of the first position locator guides and at least one of said second alignment guides to establish a known positional relationship between the first member and the second member; and a connector securing the first member and second member together in the established positional relationship.

2. The alignment guide as defined in claim 1, wherein the base defines a plurality of openings that function as the alignment guides.

3. The alignment fixture as defined in claim 1 wherein the second alignment guide includes at least two opposing arms carried by the base, the arms defining a central channel.

4. The alignment fixture as defined in claim 1, wherein the first position locator guides comprise a plurality of tabs carried by the first member.

5. The alignment fixture as defined in claim 1, wherein the second position locator guides comprise a plurality of fingers carried by the second member.

6. An alignment fixture for aligning parts used in a wafer etching machine comprising:

a base defining a plurality of alignment guide openings;

at least two opposing arms carried by the base, the arms defining a central channel;

a first ring positioned on the base and defining a plurality of first position locator guides, wherein a center of at least one of the first position locator guides is aligned with and received in the channel;

a second ring positioned on the base adjacent the first ring, and comprising a plurality of second position locator guides, wherein at least two of the second position locator guides are aligned simultaneously with the center of at least one of the first position locator guides that is aligned respectively with the channel and at least two of the alignment guides; and a screw passing through an opening defined by the first ring contacts the first ring and second ring, and when tightened, secures the first ring and second ring together in an established positional relationship.

7. An alignment fixture as defined in claim 6, wherein the first ring defines an outer perimeter and the first position locator guides comprise a plurality of axially arranged tabs extending outwardly from the outer perimeter of the first ring.

8. An alignment fixture as defined in claim 6, wherein the second ring defines a perimeter and the second position locator guides comprise a plurality of axially extending elongated fingers projecting outwardly from the perimeter of the second ring.

9. An alignment fixture as defined in claim 6, wherein one of the plurality of fingers is received in each of the alignment guide openings.

10. A method for accurately aligning parts used in a wafer etching machine comprising:

providing a base supporting at least one first alignment guide and a plurality of complementary second alignment guides arranged in a predetermined configuration;

placing a first member on the base, the first member comprising a plurality of first position locator guides;

moving the first member so that a center of at least two of the first position locator guides aligns with a center of the first alignment guide;

placing a second member on the base, the second member comprising a plurality of second position locator guides;

moving the second member so that a center of at least one of the second position locator guide simultaneously aligns with the center of the first position locator guide aligned with the first alignment guide and at least two of the second alignment guides; and securing the first member and second member in an established positional relationship.

11. An alignment method for accurately aligning two concentric rings for use in a wafer etching machine comprising:

providing a base supporting a plurality of complementary alignment guides arranged in a predetermined configuration and at least two opposing arms defining an open channel;

placing a first ring on the base, the first ring comprising a plurality of first position locator guides;

rotating the first ring so that a center of at least two of the first position locator guides aligns with a center of each channel;

placing a second ring on the base adjacent the first ring, the second ring comprising a plurality of second position locator guides;

rotating the second ring so that a center of at least one of the second position locator guides simultaneously aligns with the center of the first position locator guide aligned with each channel and a center of the alignment guides; and securing the first ring and second ring in an established positional relationship.

12. An alignment method as defined in claim 11, wherein the alignment guides comprise a plurality of openings defined by the base.

13. An alignment method as defined in claim 11, wherein the first locator guides comprise a plurality of tabs spaced axially around and extending outwardly from a perimeter of the first ring.

14. An alignment method as defined in claim 13, wherein one of the plurality of tabs is received in each channel.

15. An alignment method as defined in claim 11, wherein the second position locator guides comprise a plurality of elongated fingers arranged axially around and extending from an outer perimeter of the second ring.

16. An alignment method as defined in claim 11, wherein a screw couples the first ring and second ring together in the established positional relationship.

* * * * *